United States Patent
Krause et al.

(10) Patent No.: US 10,734,193 B2
(45) Date of Patent: *Aug. 4, 2020

(54) METHOD OF PREPARING A SAMPLE FOR MICROSTRUCTURE DIAGNOSTICS, AND SAMPLE FOR MICROSTRUCTURE DIAGNOSTICS

(71) Applicant: Fraunhofer-Gesellschaft zur Förderung der angewandten Forschung e.V., München (DE)

(72) Inventors: Michael Krause, Halle (DE); Georg Schusser, Salzatal (DE); Thomas Höche, Halle (DE); Richard Busch, Halle (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 637 days.

This patent is subject to a terminal disclaimer.

(21) Appl. No.: 15/286,699

(22) Filed: Oct. 6, 2016

(65) Prior Publication Data

US 2017/0097290 A1 Apr. 6, 2017

(30) Foreign Application Priority Data

Oct. 6, 2015 (EP) .................................... 15188587

(51) Int. Cl.
*H01J 37/305* (2006.01)
*H01J 37/26* (2006.01)
(Continued)

(52) U.S. Cl.
CPC ............ *H01J 37/3053* (2013.01); *G01N 1/32* (2013.01); *G01N 1/44* (2013.01); *H01J 37/02* (2013.01);
(Continued)

(58) Field of Classification Search
CPC ........ H01J 37/02; H01J 37/26; H01J 37/3056; H01J 37/3053; G01N 1/32; G01N 1/44
See application file for complete search history.

(56) References Cited

U.S. PATENT DOCUMENTS 5,472,566 A * 12/1995 Swann ...................... G01N 1/32
156/345.39
7,442,924 B2 * 10/2008 Giannuzzi .............. G01N 1/286
216/2
(Continued)

FOREIGN PATENT DOCUMENTS

CN  102346109 A   2/2012
DE  10 2004 001 173 B4   9/2005
(Continued)

OTHER PUBLICATIONS

Machine Translation JP 2002318178 A (Year: 2002).*
(Continued)

*Primary Examiner* — Michael A Band
(74) *Attorney, Agent, or Firm* — DLA Piper LLP (US)

(57) ABSTRACT

A method of preparing a sample for microstructure diagnostics on a sample body by material-ablating processing, and subsequently producing an examination region on the sample portion, the examination region including a target region to be examined, the method including producing a terracing zone including the target region on at least one surface of the sample portion, wherein at least one notch with flanks extending obliquely in relation to the surface is produced next to the target region by material-ablating beam processing to produce the terracing zone, and ablating material from the surface of the sample portion in the region of the terracing zone by an ion beam, which is radiated under grazing incidence onto the surface obliquely to the direction of extent of the notch such that the target region lies behind the notch in the incoming radiation direction of the ion beam (Continued)

and, as a result of the terracing in the region behind the notch, the surface is recessed substantially parallel to the original height of the surface by way of ion beam processing.

16 Claims, 8 Drawing Sheets

(51) Int. Cl.
    *H01J 37/02*     (2006.01)
    *G01N 1/44*     (2006.01)
    *G01N 1/32*     (2006.01)

(52) U.S. Cl.
    CPC ....... *H01J 37/26* (2013.01); *H01J 2237/2802* (2013.01); *H01J 2237/31745* (2013.01); *H01J 2237/31749* (2013.01)

(56) References Cited

U.S. PATENT DOCUMENTS

| | | | |
|---|---|---|---|
| 9,492,893 B2 * | 11/2016 | Krause | B23K 26/38 |
| 2006/0186336 A1 | 8/2006 | Giannuzzi et al. | |
| 2010/0300873 A1 | 12/2010 | Blackwood et al. | |
| 2013/0241091 A1 | 9/2013 | Man | |
| 2016/0356683 A1 * | 12/2016 | Krause | G01N 1/44 |

FOREIGN PATENT DOCUMENTS

| | | | |
|---|---|---|---|
| EP | 2 787 338 A1 | | 10/2014 |
| JP | H04-120437 A | | 4/1992 |
| JP | 2002318178 A | * | 10/2002 |
| JP | 2004-301557 A | | 10/2004 |
| JP | 2010-507781 A | | 3/2010 |
| JP | 2013-217898 A | | 10/2013 |

OTHER PUBLICATIONS

J. Völlner et al., "Topography evolution mechanism on fused silica during low-energy ion beam sputtering," Journal of Applied Physics, vol. 109, 043501 (2011) (Abstract).

Examination Report dated Nov. 12, 2019, of counterpart Taiwanese Application No. 105132362, along with an English translation.

Notice of Reasons for Rejection dated Mar. 3, 2020, of counterpart Japanese Application No. 2016-197311, along with an English translation.

* cited by examiner

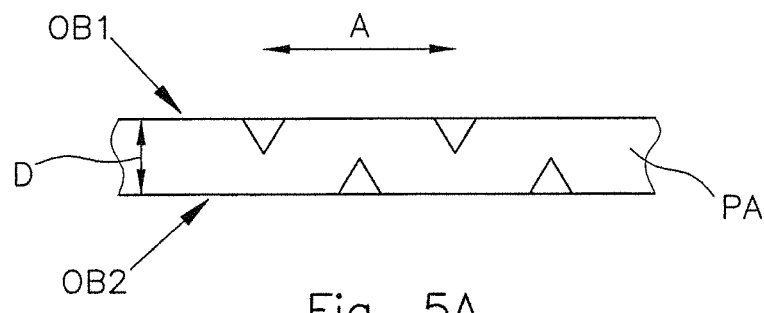
Fig. 5A
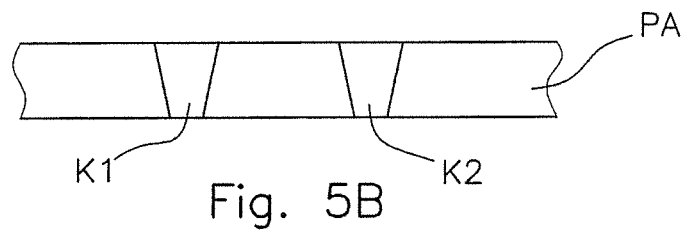
Fig. 5B
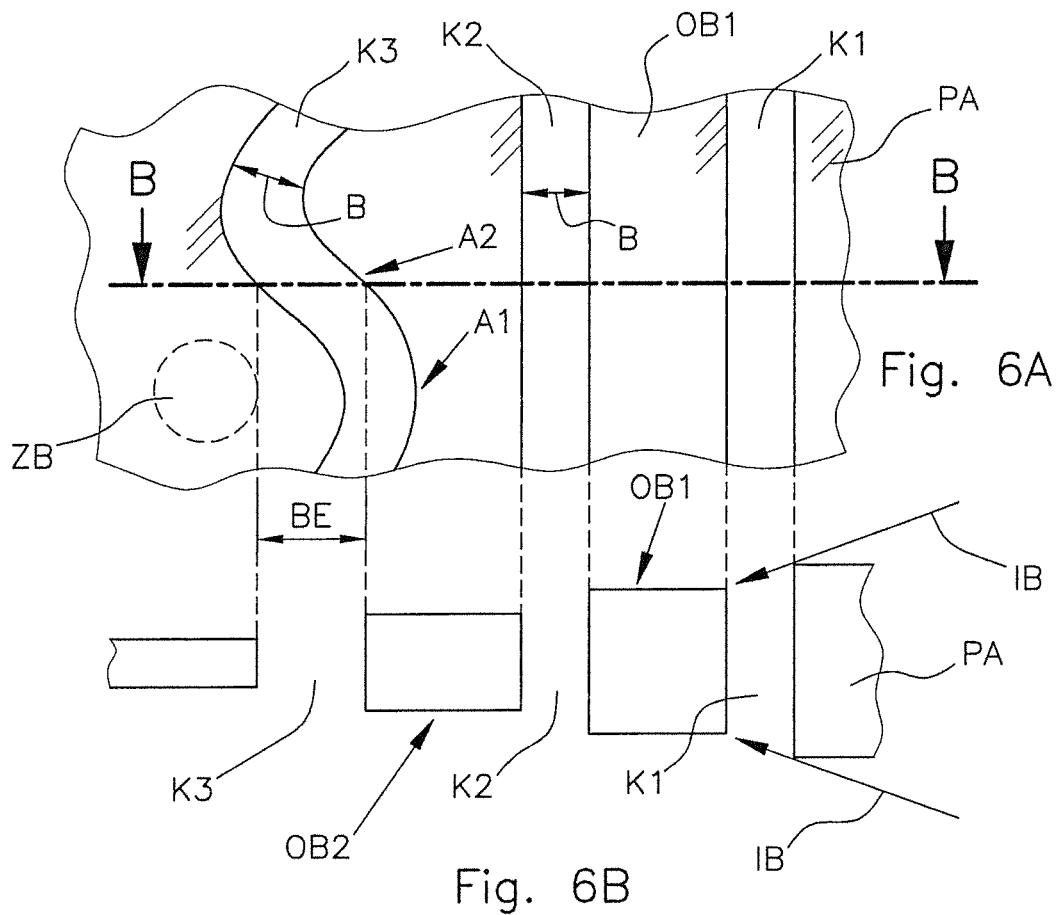
Fig. 6A
Fig. 6B

METHOD OF PREPARING A SAMPLE FOR MICROSTRUCTURE DIAGNOSTICS, AND SAMPLE FOR MICROSTRUCTURE DIAGNOSTICS

TECHNICAL FIELD

This disclosure relates to a method of preparing a sample for microstructure diagnostics, wherein a sample portion is prepared on a sample body by material-ablating processing and an examination region is subsequently produced on the sample portion, the examination region comprising a target region to be examined. The disclosure also relates to a sample for microstructure diagnostics, which may be prepared with the aid of the method.

BACKGROUND

A preferred field of application is the preparation of samples for microstructure diagnostics by transmission electron microscopy (TEM). Samples suitable for microstructure diagnostics by transmission electron microscopy are also referred to as TEM samples.

Techniques which are as accurate, low in artefacts, reliable and quick as possible are sought after for the preparation of samples for microstructure diagnostics. TEM samples require a sample portion with a relatively thin, electron-transparent examination region, i.e., an examination region through which an electron beam is able to pass. The target region to be examined should lie in this electron-transparent examination region. The target region is that spatially restricted region of interest to the examination.

In principle, thinning in a purely mechanical manner with relatively few artefacts is possible, particularly in ceramics and semiconductors, but this requires much technical skill to lead to a reproducible sample quality, at least to some extent. Moreover, there already are a multiplicity of, in part, very complicated techniques for producing sufficiently thin, electron-transparent regions on TEM samples. In particular, they include mechanical pre-thinning (grinding, polishing, cavity grinding), followed by an ion beam etching process, the cutting out of thin sections using a focused ion beam (FIB) and ultramicrotomy.

Methods for TEM sample preparation operating with a combination of laser beam processing and ion beam processing have also already been proposed. By way of example, DE 10 2004 001 173 B4 describes a method of preparing TEM samples, in which material is ablated from a substrate of a sample material by ultrashort pulse laser ablation in a vacuum chamber such that a narrow web remains, the latter subsequently being bombarded at a flat angle by noble gas ions such that an electron-transparent region arises in the region of the web.

Currently, the assumption is made that the laser-based sample preparation may only be a first step for preparation of TEM samples due to the non-negligible laser influence layer, and the first step should be followed by a less damaging second step in which the electron beam transparency is established. The second step is typically carried out using a focused ion beam (FIB) or a broad ion beam (BIB).

Processing by a focused ion beam (FIB processing) and the broad beam processing (BIB processing) differs, inter alia, in respect of the arising costs. While a broad ion beam etching installation is commercially available for moderate procurement costs, barely raises follow-up costs apart from electricity and etching gas and maintenance costs and may be operated without problems by technical staff, the procurement of an installation for FIB processing is reflected in the budget by much higher procurement costs, the installation being substantially more expensive in terms of maintenance and requiring an operator with significantly better training than a broad ion beam etching device.

Moreover, there is a clear difference in terms of the accessible geometry between samples produced by FIB and broad ion beam preparations. As a result of the relatively low dose, the overall volume ablation rates of FIB beams are significantly lower than those of broad ion beam installations. As a result, practical limits are placed on the FIB technology in respect of the accessible sample dimensions—these days, typical FIB lamellas for the examination by TEM have dimensions of, e.g., $20 \times 5 \times 0.5$ $\mu m^3$.

On the other hand, examination of large-area TEM preparations is becoming ever more important. This is true, for example, in view of the TEM examination of 3-D integrated microelectronic components. Attempts are made to prepare a relatively large area, thin sample portion from a sample body by material-ablating processing, e.g., by laser beam processing, and to subsequently produce an electron-transparent examination region, comprising a target region to be examined, in the sample portion.

It could therefore be helpful to provide a method of the type set forth at the outset, by which it is possible to create conditions in pre-prepared sample portions in a laterally targeted manner and in a relatively short time, with as little damage as possible being made to the material to be examined, the conditions rendering it possible to examine a target region of interest by a method from microstructure diagnostics, in particular by transmission electron microscopy. It could further be helpful to provide a sample for microstructure diagnostics, in particular by transmission electron microscopy, the sample having an examination region suitable for examination, prepared with little damage in a predeterminable target region.

SUMMARY

We provide a method of preparing a sample for microstructure diagnostics on a sample body by material-ablating processing, and subsequently producing an examination region on the sample portion, the examination region including a target region to be examined, the method including producing a terracing zone including the target region on at least one surface of the sample portion, wherein at least one notch with flanks extending obliquely in relation to the surface is produced next to the target region by material-ablating beam processing to produce the terracing zone, and ablating material from the surface of the sample portion in the region of the terracing zone by an ion beam, which is radiated under grazing incidence onto the surface obliquely to the direction of extent of the notch such that the target region lies behind the notch in the incoming radiation direction of the ion beam and, as a result of the terracing in the region behind the notch, the surface is recessed substantially parallel to the original height of the surface by ion beam processing.

We also provide a sample for microstructure diagnostics obtainable or obtained by the method of preparing a sample for microstructure diagnostics on a sample body by material-ablating processing, and subsequently producing an examination region on the sample portion, the examination region including a target region to be examined, the method including producing a terracing zone including the target region on at least one surface of the sample portion, wherein at least one notch with flanks extending obliquely in relation to the surface is produced next to the target region by material-ablating beam processing to produce the terracing zone, and ablating material from the surface of the sample portion in the region of the terracing zone by an ion beam, which is radiated under grazing incidence onto the surface obliquely to the direction of extent of the notch such that the target region lies behind the notch in the incoming radiation direction of the ion beam and, as a result of the terracing in the region behind the notch, the surface is recessed substantially parallel to the original height of the surface by way of ion beam processing, including a sample portion having an examination region including a target region to be examined, wherein at least one notch with flanks extending obliquely in relation to the surface lies next to the examination region on at least one surface of the sample portion and a surface level on the side of the notch distant from the examination region is higher than the surface level in the examination region.

BRIEF DESCRIPTION OF THE DRAWINGS

Further advantages emerge from the subsequent description of preferred examples explained below on the basis of the figures.

FIGS. 5A and 5B show different possibilities of producing notches on both sides of a relatively thin sample portion.

FIGS. 6A and 6B show a schematic top view of a portion of a surface of the sample portion (FIG. 6A) and a vertical section through the sample portion (FIG. 6B) along the line B-B in FIG. 6A.

DETAILED DESCRIPTION

Figure 1:
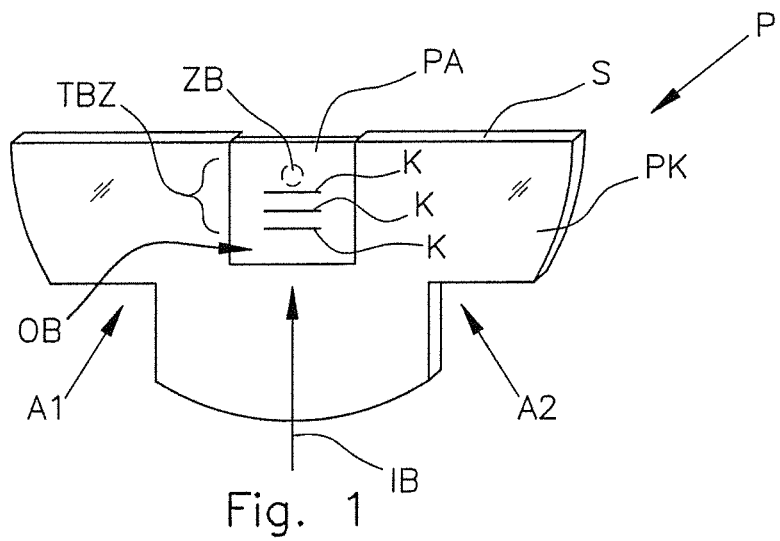
FIG. 1 shows an oblique top view of an example of a sample for microstructure diagnostics by transmission electron microscopy, during a phase of the preparation process.

In the method, a terracing zone comprising or containing the target region to be examined is produced in at least one surface of the sample portion. For the purposes of producing the terracing zone, at least one notch, having flanks extending obliquely in relation to the surface, is produced next to the target region, i.e., with the lateral offset from the target region, by material-ablating beam processing. The term "notch" denotes an incision introduced into the depth of the sample portion from the surface, the incision extending in a predeterminable direction of extent and generally having a length, measured in the direction of extent, which is many times greater than the width of the notch which is measurable perpendicular to the direction of extent. A notch may optionally also be referred to as a gap. The term "oblique" denotes a direction or orientation deviating by a specific angle from an (imaginary) line or plane, i.e., a non-parallel orientation. This includes a perpendicular orientation just as much as it includes oblique orientations deviating therefrom. By way of example, in the cross section, a notch may have a V shape or flanks oriented approximately perpendicular to the surface.

In a sufficiently thin sample portion and a corresponding depth of the notch, the notch may pass from one surface to the opposite surface of the sample portion in the style of a penetrating slot. It is also possible for the notch to end within the sample portion in the style of a trench or groove and therefore have a depth less than the thickness of the sample portion at the corresponding location. The flanks of the notch may be more or less perpendicular to the surface or extend at an angle thereto deviating significantly from 90° and may merge into the surface in the region of the adjoining surface with formation of a more or less pronounced edge. The angle between surface and flank in the region of the edge may, e.g., be 90° to 75°.

After completion of the notch production operation, material of the sample portion is ablated from the surface in the region of the terracing zone by an ion beam in a further method step. The ion beam is radiated onto the surface under grazing incidence (relatively small angle in relation to the surface) and obliquely in relation to a direction of extent of the notch. The incoming radiation direction of the ion beam may extend perpendicular to the direction of extent of the notch or, deviating from the perpendicular orientation, obliquely in relation thereto and it is selected such that the target region lies behind the notch in the incoming radiation direction of the ion beam.

By way of example, the ion beam may be a focused ion beam (FIB) or a broad ion beam (BIB).

Terraces are formed within the terracing zone under these incoming radiation conditions of the ion beam, the terraces spreading substantially in the incoming radiation direction of the ion beam over time. This results, inter alia, from different etching rates of the sample material in a manner dependent on the local angle of incidence of the ions of the ion beam in the region of that flank of the notch which lies closer to the target region and directly irradiated by the ion beam at the transition between flank and surface, i.e., in the region of the edge thereof. This flank is also referred to as "rear flank" because, when considered in the beam direction of the ion beam, it lies behind the flank opposite thereto, which lies further away from the target region and is also referred to here as "front flank."

Due to the grazing incidence (relatively small angle (e.g., less than 15°) between the surface of the sample portion and the incoming radiation direction of the ion beam) and the oblique orientation of the rear flank in relation to the surface, the ions of the ion beam are incident more or less perpendicular on that upper portion of the rear flank which is not shadowed by the opposite flank (front flank). At the same time, the ions radiated-in under grazing incidence are incident on the surface behind the notch, i.e., on the side of the notch facing the target region, at a very flat angle relative to the surface. In the etching rates of the ion beam processing, which typically depend strongly on the angle of incidence, these differences in the angle of incidence lead to terraces spreading many times faster in the direction parallel to the original surface than what they progress in terms of depth. Hence, a type of step in the surface arises in the region of the notch such that the surface behind the notch, as seen in the direction of the incoming radiation, was ablated more strongly, and therefore lies lower, than in the region in front of the notch. With increasing radiation time, the step moves away from the notch.

In this case, the height of the step, i.e., the level difference between the surface regions in front of and behind the notch, is substantially a function of the angle of incidence of the ion beam and the effective width of the notch measured in the incoming radiation direction. The step height increases with increasing effective width of the notch at the respective location. As a result of the terracing in the region behind a notch, the surface is recessed substantially parallel to the original height of the surface by way of ion beam processing such that uniform recessing of the surface of the sample portion in relation to the original level of the surface may be obtained in this manner, the recessing being exactly definable by the geometry of the arrangement.

What may be achieved thereby for TEM samples in a suitable procedure is that the sample portion, first, is thin enough for TEM examination in the target region of interest, but, second, does not contain a hole caused by the ion beam processing in the immediate target region. Such thinning is advantageous, inter alia in the interest of stability, and offers the possibility of producing relatively large, electron-transparent examination regions and/or electron-transparent examination regions at a plurality of positions defined in advance.

The method may also be applied advantageously in samples for other examination methods of microstructure diagnostics, e.g., in samples for x-ray microscopy (XRM) or for atomic probe tomography (APT). In this case, the examination region need not be electron-transparent. Instead, the procedure described above may be used substantially exclusively for the purposes of removing material in the region near the surface, which may have been damaged by a preliminary preparation.

The method may be designed to prepare a sample suitable for microstructure diagnostics by transmission electron microscopy (TEM), wherein an electron-transparent examination region, i.e., an examination region through which an electron beam is able to pass, in which the target region lies, is produced in the sample portion. By way of example, the examination region may have a thickness or material strength from a few nanometers (e.g., 10 nm) to several 100 nm (e.g., up to 0.5 µm).

The notch is introduced into the surface of the sample portion by laser beam processing in preferred examples of the method. With laser micro-processing, an instrument is available, with which (penetrating or non-penetrating) notches may be introduced in a targeted manner into a pre-processed thin sample portion, for example, by way of laser processing such that terraces emanating therefrom may be guided precisely over the surface of the sample portion. Alternatively, it is also possible to introduce a notch with the aid of an ion beam, for example, a focused ion beam (FIB). Using this, it may be possible to produce notches with smaller widths and depths than in laser beam processing. FIB processing may be advantageous, for example, for final thinning of FIB lamellas which are only still a few 100 nm thick.

It may be sufficient for only a single notch to be introduced into the terracing zone. However, a plurality of notches extending with lateral distance from one another, which may, e.g., lie parallel to one another, are often produced in the terracing zone. The lateral distance may be measured perpendicular to the direction of extent of the notches. By way of a family of notches with two or more notches lying offset from one another, it becomes possible to produce a multiple of the step height arising at a single notch by way of ion beam processing if the etching time (irradiation time) is selected such that the steps may move or propagate over a plurality of notches. As a result, it is possible to obtain successive lowering of a surface by a multiple of the terrace step height obtainable at a single notch.

In principle, there is no limit to the number of notches in the terracing zone. However, in the interests of restricting the production time for the notch, the mutual influencing of the ablated material and of the stability, we found it to be expedient to provide only a relatively small number of notches for a corresponding target region, for example, two, three, four, five or six notches.

The mutual distance of notches offset from one another, e.g., notches parallel to one another, may be used as a further influencing parameter to control the process. In principle, the steps may be produced more quickly, the smaller the distance between adjacent notches is. On the other hand, stability of the sample may be adversely affected by notches which lie too close together. The distance between adjacent notches, measured perpendicular to the general direction of extent of the notches, may be matched to the width of the notches in this direction. By way of example, the distance may lie between two times and ten times, in particular between two times and five times, the width of an individual notch. It may possibly also be greater than this.

It is possible to influence the process of thinning by way of the design and dimensions of the notches. Here, e.g., the width of a notch measured at the surface has a decisive influence on the step height, arising at the notch, between the upstream surface and the downstream surface. We found it to be advantageous if the notch is produced, e.g., by laser beam processing such that a width of the notch (measured at the surface) is from approximately 10 µm to approximately 50 µm. In typical angles of incidence of ion beams in commercial ion beam processing installations (e.g., 4° to 10° in relation to the surface), this yields useful step heights in the region of a few micrometers per notch. By way of example, under the assumption of an ion beam angle of incidence of 80° (measured relative to the surface normal), a notch with a width of 15 µm will lead to a step height of approximately 2.5 µm in ion irradiation perpendicular to the direction of extent of the notch.

Particularly in such cases, we found it to be advantageous if the distance between immediately adjacent notches is 20

µm to 100 µm, in particular approximately 50 µm to approximately 80 µm. As a result of this, it is possible to obtain a good compromise between a sufficiently fast processing time and sufficient stability.

If a notch only has a width of approximately 250 nm, a step height of approximately 44 nm would arise under the same incoming radiation conditions. Such narrow notches (e.g., with a width from approximately 50 nm to approximately 250 nm) may be produced by, e.g., FIB processing. The range of expedient distances between adjacent notches would be correspondingly smaller. In this case, distances of, e.g., 200 nm to 500 nm could be expedient.

A notch may have a substantially constant width (within the scope of process-related variations) over the entire length thereof. However, this is not mandatory. In some method variants, at least one notch having a width varying in the direction of extent is produced. By way of example, a notch may have one or more local broadening regions or, in a plan view, have a wedge-shaped design such that the width continuously increases or decreases along the direction of extent. As a result of this, it is possible to obtain locally different ablation heights along the extent of a notch, with it being possible to predetermine the ablation heights by the width profile. Preferably, no further notches should lie between this notch and the target region. As a result, different ablation heights may be predetermined particularly accurately.

In many cases, one or more notches with a straight-line profile are produced in the terracing zone. These are producible in a particularly simple manner. However, a straight-line profile is not mandatory. In some method variants, at least one notch having a non-linear extent with a changing direction of extent is produced. By way of example, the notch may have an arcuate extent or an extent in the form of a semicircle. It is also possible for a notch to have a meandering extent or an extent which, in general, goes to and from. In a notch with a substantially constant width, different effective widths of the notch (measured parallel to the incoming radiation direction of the ion beam) emerge due to the orientation of the notch portions, changing along the extent of the notch, in relation to the incoming radiation direction of the ion beam, as result of which different ablation heights or step heights are also obtainable in the regions behind the notch portions. Therefore, it is possible to control the spatial distribution of ablation heights in a targeted manner by prescribing certain non-linear extents of notches. Preferably, no further notch should lie between this notch with a non-linear extent and the target region. As a result, different ablation heights may be predetermined particularly accurately.

It is possible only to lower a single surface of a sample portion in a step-like manner with the aid of the method. In some cases, provision is made for the sample portion to be processed on both sides during the notch production operation such that at least one notch is introduced on both a first surface of the sample portion and the opposite second surface of the sample portion such that a terracing zone arises on both sides of the sample portion in each case and such that, thereafter, material is ablated in the region of the terracing zone by an ion beam under grazing incidence in the manner described above on the first surface and the second surface. In this way, the processing time to the finished sample may be reduced further.

There may be deposits on the surface in the vicinity of the produced notch, or in the edge region at the transition between flank and surface, when producing the notches, for example, by laser beam processing. Examinations have shown that such debris deposits may lead to rougher ablation areas. One option to avoid such problems consists of applying a protective layer onto the surface prior to the material-ablating beam processing to produce a notch, the notch in the sample portion subsequently being produced through the protective layer and the protective layer subsequently being removed from the surface again. Possible deposits are then deposited on the protective layer and may be removed with the latter such that very clean edges between flank of the notch and adjoining surface and very clean surfaces without deposits are present in the region of the notches. The ablation conditions in the subsequent ion beam processing may be designed particularly accurately and uniformly over the length of the notch.

It is possible to carry out ablation of material by an ion beam as a static process such that the incoming radiation direction of the ion beam does not change over the entire irradiation time. As a result, exactly defined geometric conditions are predeterminable in the region of the notches. However, it may also be expedient to vary the incoming radiation direction of the ion beam in an azimuthal direction and/or in a vertical direction, periodically or aperiodically over a corresponding angle of incidence range, for example, over an angle of incidence range of ±5° and about a principal incoming radiation direction, during ablation when ablating the material by the ion beam. As a result, it may be possible, for example, to avoid the unwanted "curtain" effect, i.e., a formation of wave-like structures on the surface proceeding from locations with reduced ablation rates.

We also provide a sample for microstructure diagnostics, wherein the sample, in particular, is obtainable or obtained by our method.

The sample comprises a sample portion having an examination region comprising a target region to be examined. At least one notch with flanks extending obliquely in relation to the surface lies next to the examination region on at least one surface of the sample portion. A surface level on the side of the notch distant from the examination region is higher than the surface level in the examination region. Alternatively, or additionally, a sample thickness on the side of the notch distant from the examination region may be greater than the sample thickness in the examination region.

Various aspects of exemplary methods are explained below. What is common to the methods is a targeted introduction of microscale or nanoscale notches or gaps in a sample portion to thereby obtain defined ablation processes by subsequent ion beam processing.

For reasons of overview and clarity, the same or similar elements in the various examples are partly denoted by the same reference signs.

FIG. 1 shows an oblique top view of an example of a sample P for microstructure diagnostics by transmission electron microscopy (TEM), during a phase of the preparation process or production process of the sample. The sample, which is also referred to as a TEM sample, has a substantially plate-shaped sample body PK prepared by laser processing from a larger material piece of the material to be examined. The generally plate-shaped sample body, which may have a thickness of, e.g., approximately 100 µm to 150 µm, or up to 250 µm, approximately has the basic shape of a semi-circle. Two triangular recesses A1, A2 are provided opposite a side S dividing the circle in half, the triangular recesses being delimited by two edges aligned perpendicular to one another. This geometry simplifies the attachment of the sample body or the entire sample, with the correct position, in a clamp, not described in any more detail here, in which the sample or the sample body may be fixed for various processing steps of the preparation process. The geometry of the sample body is similar to the geometry of samples described in EP 2 787 338 A1 together with the function of the recess. In this respect, reference is made to the description therein.

A substantially plate-shaped sample portion PA has been prepared approximately centrally on the line dividing the circle on the side S lying opposite to the recesses from the material of the sample body by laser processing. The sample portion PA approximately has the form of a plane-parallel lamella, the thickness of which (measured perpendicular to the extent of the plane) may be, e.g., 10 to 20 µm. The target region ZB of the sample, i.e., the region which should be examined in view of the microstructure and other properties thereof with the aid of a transmission electron microscope after completion of the sample preparation, lies within the sample portion PA.

In TEM samples, the method can produce an examination region which is transmissive for electron beams, i.e., an electron-transparent examination region, in the sample portion PA, the examination region including the target region ZB such that the latter may be examined. In many materials, electron transparency may be achieved if a residual thickness of the order of 10 nm or several 10 nm, at most a few 100 nm, preferably less than 1 µm, remains in the examination region.

Production of the electron transparency should be directed to the greatest possible extent to the target of not damaging the sample, or only damaging it to a negligible extent, and of requiring only as little processing time as possible overall. To this end, there is no requirement in the exemplary case to bring the entire sample portion PA, which is substantially larger compared to the target region of interest, to have electron transparency. Instead, it is sufficient to carry out the target preparation only in a small portion of the sample portion. Moreover, attempts are made to thin the lamella-like thin sample portion PA to be as plane parallel as possible, inter alia in the interest of stability so that the sample in the target region ZB is thin enough for the TEM examination, but there is no hole immediately in the target region. Using the method example described here, this goal can be achieved systematically and reproducibly.

In the exemplary case, a terracing zone TBZ is produced on the plane surface OB of the sample portion PA visible in FIG. 1 during the method, the terracing zone subsequently being irradiated by an ion beam IB (e.g., an Ar$^+$ broad ion beam) under grazing incidence to ablate material in a targeted step-by-step manner within the terracing zone. Details in this respect are explained in more detail in conjunction with FIGS. 1 and 2A to 2D.

Figure 2A:
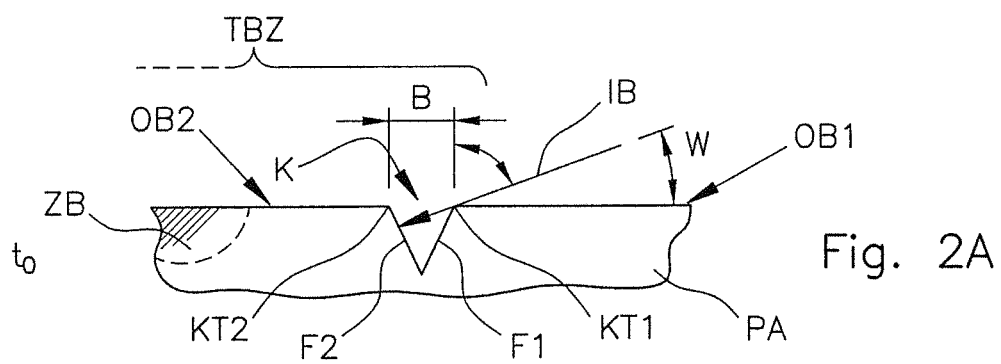
FIGS. 2A to 2D schematically show the development of an arising terrace over time in ion beam etching under grazing incidence of an ion beam in the region of a notch.
Figure 2B:
Figure 2C:
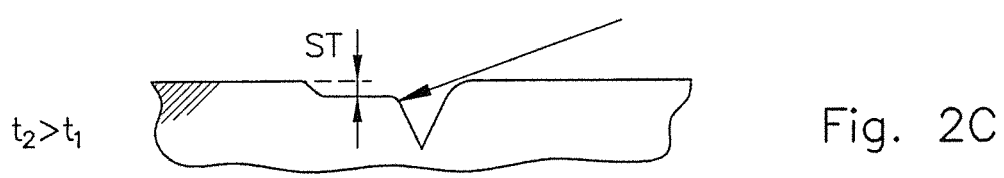

For the purposes of producing the terracing zone, at least one notch K with flanks F1, F2 extending obliquely in relation to the surface OB is produced next to the target region ZB by material-ablating beam processing with the aid of a laser (cf. FIG. 2A). In the example of FIG. 1, three mutually parallel straight-lined notches K1, K2, K3 were produced next to the target region ZB, the notches having a distance from one another in the incoming radiation direction of the ion beam IB (depicted by an arrow).

After completion of the notch production operation, material of the sample portion PA in the region of the terracing zone TBZ is ablated with the aid of an ion beam 113 which, under grazing incidence, is radiated obliquely, possibly approximately perpendicular, to the direction of extent of the notches onto the surface OB such that the target region ZB lies behind the notch K1, K2, K3 or K in the incoming radiation direction (see mows in FIG. 1).

FIG. 2 shows the conditions in the region of a notch K of the terracing zone TBZ at different times during the ion beam processing. From this, it is possible to vividly identify how the terraces arise during ion beam etching under grazing incidence of an ion beam in the region of the notch.

FIG. 2A shows a schematic section through a sample portion PA perpendicular to the plane surface thereof in the region of a notch K which, in the exemplary case, extends in a straight line perpendicular to the plane of the drawing. The notch K has a depth, measured perpendicular to the surface, which is less than the thickness of the sample portion measured in this direction such that the notch does not penetrate through to the opposite surface. The notch with a substantially V-shaped cross section has a first flank F1 extending obliquely in relation to the surface and an opposite second flank F2, likewise extending obliquely in relation to the surface, the flanks running towards one another in a V-shaped manner and meeting at the base of the notch. In the region of an associated edge (first edge KT1, second edge KT2), the oblique flanks merge into the surface regions (first surface region OB1, second surface region OB2) adjoining these.

At the level of the surface, the notch has a width B, measured perpendicular to the direction of extent, which may be, e.g., 10 µm to 30 µm. Like the three notches K1, K2 and K3 in FIG. 1, the notch K is aligned such in relation to the incoming radiation direction (arrow) of the ion beam IB for the step of material ablation by ion irradiation that the ion beam is radiated substantially perpendicular to the direction of extent (longitudinal extent) of the notches.

The ion beam IB is radiated in under grazing incidence, in this case meaning that only a relatively small angle W of e.g., less than 15° is included between the original surface OB and the incoming radiation direction of the ion beam. In particular, this angle can be 4° to 10°. In the style of the conditions during x-ray diffraction, this angle measured in a plane lying perpendicular to the surface is also referred to as glancing angle W. This should be distinguished from the ion angle of incidence IAW. The ion angle of incidence IAW refers to the angle which the incoming radiation direction of the ion beam includes with the normal of the surface at the point of incidence at the respective surface. In the region immediately in front of the front edge KT1, the ion angle of incidence IAW emerges as complementary angle at 90° to the glancing angle W. On the rear flank F2, the ion beam is incident almost in a perpendicular manner, which, in relation to the normal of the rear flank, corresponds to an ion angle of incidence near 0°.

Under these incoming radiation conditions, formation of a terrace which, as shown in FIGS. 2A to 2D, spreads substantially in the direction parallel to the incoming radiation direction is observed within the terracing zone TBZ, in the region behind a notch. This development of topography results primarily from the ion etching rate varying relatively strongly in a manner dependent on the ion angle of incidence in practically all relevant materials. In many materials, the ablation rate in ion irradiation has a maximum in the range of ion angles of incidence of approximately 50° to approximately 75° and, proceeding from this maximum, it reduces more and more towards smaller and larger ion angle of incidence values in a material-specific manner, with the ablation rate at the maximum often differing from the minimum ablation rate by a factor of 2 to 10. By way of example, Winer, B. Ziberi, F. Frost, and B. Rauschenbach, Topography evolution mechanism on fused silica during low-energy ion beam sputtering, J. Appl. Phys. 109, 043501 (2011) determined the dependence of the fused silica sputtering ablation rate on the ion angle of incidence and it was shown that, under the employed conditions, the maximum etching rate was obtained for an ion angle of incidence of approximately 75°. It greatly reduces to larger angles of incidence (up to the grazing incidence at 90°) and to smaller ion angles of incidence (up to the perpendicular incidence in the case of an ion angle of incidence equal to 0°). By way of example, the dependence of the sputtering ablation rate on the ion angle of incidence in the case of silicon was described in: A. Barna, Mat. Res. Soc. Proc. 254 (1992) 3-22. There, the maximum etching rate lies at an ion angle of incidence of approximately 55° and the ablation rate significantly reduces towards larger and smaller values.

Our methods use this dependence in a particular manner. The topographic development depicted schematically in FIGS. 2A to 2D, with terracing, results primarily from the different etching rates in the region of the rear edge KT2, at which the rear flank F2 of the notch K, closer to the target region ZB, merges into the adjoining surface OB2. In the region of this edge, the ion beam IB with grazing incidence is incident virtually perpendicularly onto the rear flank F2, as a result of which a relatively high ablation rate sets in. In contrast thereto, the ions on the adjacent surface OB2 are incident in a relatively flat manner, i.e., at a relatively large ion angle of incidence (e.g., between 80° and 86°) relative to the surface normal. These differences lead to a significantly faster spread of the terrace in the direction of the target region (to the left in FIGS. 2A to 2D) than in the depth direction (downward in FIGS. 2A to 2D). The (rear) edge KT2, at which the terracing sets in, is also referred to as "initial edge" for generation of terraces.

Figure 2D:
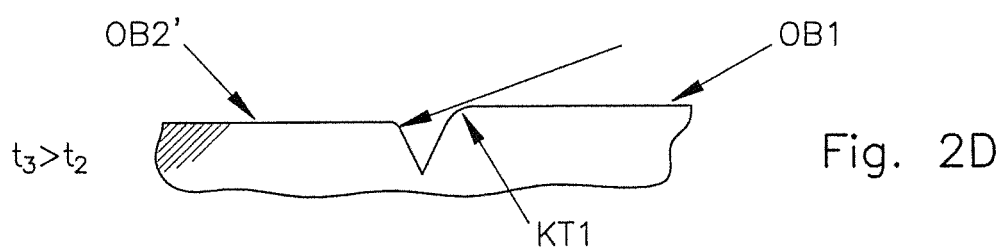

FIG. 2A shows the situation at the start of the ion irradiation at the time $t_0$, where no notable material ablation has yet taken place in the region of the flanks. At a later time $t_1 > t_0$ (see FIG. 2B), the material ablation in the region of the initial edge has already set in and a step is pushed in the direction of the target region ZB with an ever increasing distance from the notch A. At a later time $t_2 > t_1$ (FIG. 2C), the step has advanced further and a terrace, which is becoming ever broader, forms at a level below the original height level of the second surface OB2. In further continuing ion irradiation, the step has moved out of the illustrated region in the direction of the target region ZB at the time $t_3 > t_2$ (FIG. 2D). The height level of the surface OB2' produced thus lies below the height level of the original surface OB2, with the level difference being given by the step height ST, substantially determined by the glancing angle of the ion beam and the effective width B of the notch in the beam direction.

The following considerations may serve to estimate dimensions. Typical laser beam diameters may be, e.g., 10 µm to 20 µm, and so notches with widths B of approximately this dimension may be produced with the aid of a focused laser beam. Under the assumption of an ion angle of incidence of 80° (in relation to the surface normal of the surface OB) or a glancing angle W of approximately 10°, a notch with a width of 15 µm leads to a step height ST of approximately 2.5 µm in ion irradiation normal to the line direction of the notch.

Figure 3A:
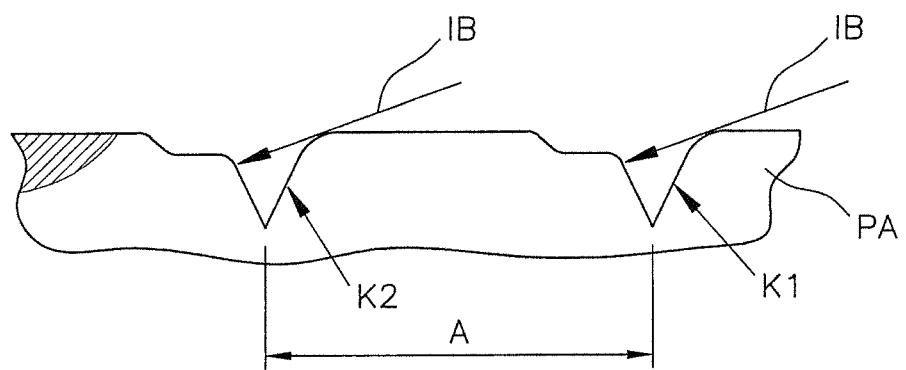
FIGS. 3A to 3C show the effect of successively lowering a surface by a multiple of a single terrace level height at a plurality of successive notches.
Figure 3B:
Figure 3C:
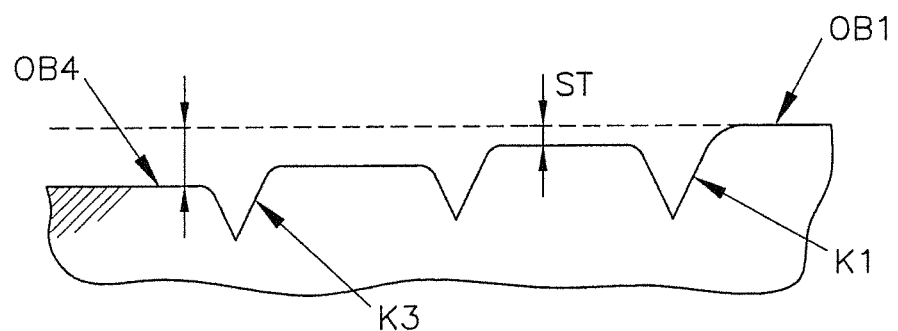

It is possible to obtain material ablation by a multiple of a step height obtainable at a single notch. A corresponding effect of successive lowering of a surface by a multiple of a single terrace step height is explained in an exemplary manner on the basis of FIGS. 3A to 3C. To this end, FIG. 3A shows a schematic section through a sample portion PA, into which two mutually parallel notches K1, K2 were introduced by laser beam processing. In oblique irradiation by an ion beam IB, the effect of terracing, explained in conjunction with FIGS. 2A to 2D, occurs behind the rear flank in the incoming radiation direction at each notch. By way of example, the distance A of immediately successive notches may be 50 to 80 µm, possibly also less than that (e.g., down to 20 µm) or more than that (e.g., up to 100 µm or more). If the etching time, i.e., the duration of irradiation with ion irradiation, is now selected such that the steps forming behind the individual notches may spread over a plurality of successive notches (see FIG. 3B), it is possible to obtain the lowering of a surface by a multiple of the step height obtainable at a notch. In the example of FIG. 3C, the level of the surface OB4 behind the third notch K3 is lowered in relation to the level of the surface OB1 in front of the first notch K1 by approximately three times the step height ST which emerges at an individual notch.

Figure 4A:
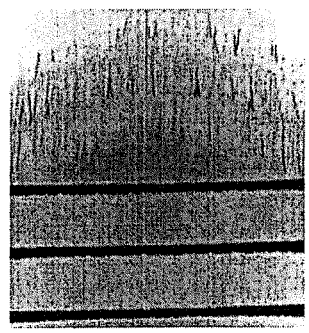
FIGS. 4A and 4B show the results of an example on the basis of light-microscopic recording of the surface of a sample portion, into which three mutually parallel notches were introduced by laser beam processing (FIG. 4A), and a diagram of a laser-profilometric measurement of the step-like surface structure after completion of the ion irradiation (FIG. 4B).
Figure 4A:
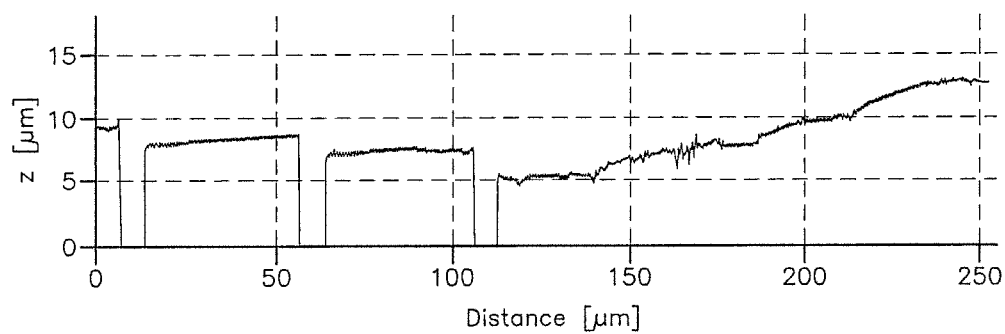
Figure 4B:
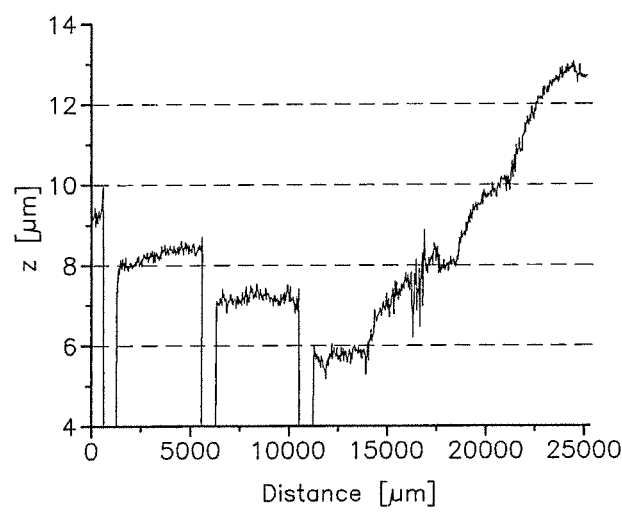

Our experimental examinations prove that the processes schematically depicted here may lead to the desired result in practice. To this end, the results of an exemplary experiment are vividly depicted in FIGS. 4A and 4B. FIG. 4A shows a light-microscopic recording of the surface of a sample portion, into which three mutually parallel notches (lines appearing black) were introduced by laser beam processing. Steps formed after irradiation with a broad ion beam. FIG. 4B shows the diagram of a laser profilometric measurement of a terrace spread over three parallel notches with an overall lowering of the rear-most surface by approximately three times the individual step height obtainable at an individual notch. FIG. 4B vividly proves that introduction of three mutually parallel notches renders it possible to obtain a lowering of the surface lying behind the last notch in relation to the surface lying in front of the first notch by three times a single step height.

Even though it is possible with the aid of the method to lower only a single surface of a sample portion step-by-step, provision is made in many cases for the sample portion to be processed on both sides during a notch production operation such that at least one notch is introduced on both a first surface of the sample portion and an opposite second surface of the sample portion, and so a terracing zone arises on both sides of the sample portion and, thereafter, material is ablated in the manner described above in the region of the terracing zone on the first surface and the second surface by an ion beam under grazing incidence. By way of example, this may be expedient if damaged zones should be removed from both sides of the sample portion by way of an ion beam-based depth ablation. The extent of structural damage, which, e.g., arose by ultrashort pulse laser processing, is typically in the region below 2 µm and therefore exactly of the order of a reproducibly obtainable step height.

FIGS. 5A and 5B show, in an exemplary manner, different options that produce notches on both sides of a relatively thin sample portion PA which, in the exemplary case, has a thickness D of approximately 10 to 15 µm measured between the surfaces OB1 and OB2. As shown in FIG. 5A, groove-like notches can be introduced onto both surfaces, the notches not penetrating through to the opposite side but only scratching the surfaces. In the two-sided application of non-penetrating notches, as sketched schematically in FIG. 5A, it may be expedient in view of the stability of the sample if the notches are not arranged directly opposite one another, but are offset in relation to one another such that a notch on one side does not lie opposite a notch on an opposite side. As shown in FIG. 5B, it is also possible, for example, by laser beam processing, to introduce notches K1, K2 into the sample portion PA such that the notches pass through from the first surface OB1 to the second surface OB2. In such penetrating notches, both the entrance opening and the exit opening can form terraces at the respective surface.

As already mentioned, the distance A between notches in a plurality of notches arranged in succession should be as small as possible to achieve the desired lowering of the surface level within short etching times. On the other hand, the distance should not become so small that the stability of the processed sample portion is noticeably impaired. Typical distances of an order of approximately 20 µm to approximately 100 µm were found to be particularly practical, with this, however, not intended to be understood in a limiting fashion.

FIG. 6 shows a different example, with FIG. 6A showing a schematic top view of a portion of a surface of a sample portion PA and FIG. 6B showing a vertical section through the sample portion along the line B-B in FIG. 6A. A peculiarity of this example consists in the notch K3 closest to the target region ZB having a meandering extent, while the notches K1, K2 arranged upstream thereof in the ion beam direction each have a linear extent and extend parallel to one another. The notches in each case pass completely through the thin sample portion PA, and so a terracing zone arises both on the first surface OB1 and on the opposite second surface OB2.

As shown in FIG. 6B, both surfaces are processed by ion beam processing under grazing incidence of a broad ion beam IB after the notch production operation and recessed in a step-by-step manner thereby. When measured perpendicular to the direction of extent thereof, for example, defined by the center lines of the respective notches, all notches K1, K2, K3 have the same width B. In the notches K1 and K2, this width B also corresponds to the effective width which emerges in the incoming radiation direction of the ion beam (direction of the arrow). However, in the case of the meandering third notch K3, the effective width BE, as measured in the incoming radiation direction, varies in a manner dependent on the position along the notch at which the effective width is measured. In the first notch portions A1 extending substantially parallel to the other notches K1, K2 and therefore perpendicular to the incoming radiation direction, the effective width BE corresponds to the width B of the notch. In the second notch portions A2 extending obliquely in relation to the incoming radiation direction due to the meandering form, the effective width BE is greater than the width B. As a result, the step height or ablation height behind the third notch K3 varies spatially between a minimum step height corresponding to the step height at the other two notches K1, K2, and maximum step heights emerging in the regions extending at an angle, e.g., at 45°, in relation to the incoming radiation direction. Thus, a greater material ablation (greater ablation depth) emerges behind the obliquely extending second notch portions A2.

This effect can be used to monitor the process of ablation within the meaning of a thickness determination and terminate the latter when a desired target thickness in the target region ZB is reached. For the purposes of determining the thickness, the region behind the meandering notch K3 closest to the target region can be monitored optically, or in any other manner, for the formation of holes. In uniform ion irradiation, the regions behind the meandering notch K3 which lie behind the obliquely oriented second notch portions A2 are ablated more strongly than adjacent regions which lie behind the first notch portions A2 with a smaller effective width. Therefore, formation of holes will initially set in behind the second notch portions A2, while a residual thickness of sample material still remains adjacent thereto. The material ablation by the ion beam can be stopped as soon as formation of a hole is observed. The position of the notch K3 with the nonlinear extent and the position of the second notch portions at particularly oblique angles can now be adapted to one another such that the target region lies behind a portion with less material ablation, and so no hole formation occurs in this portion but the residual thickness is equally sufficiently thin to exhibit electron beam transparency.

Observation of hole formation in regions, predetermined in a targeted manner, next to the target region can therefore be used for the in-line thickness measurement.

Figure 7:
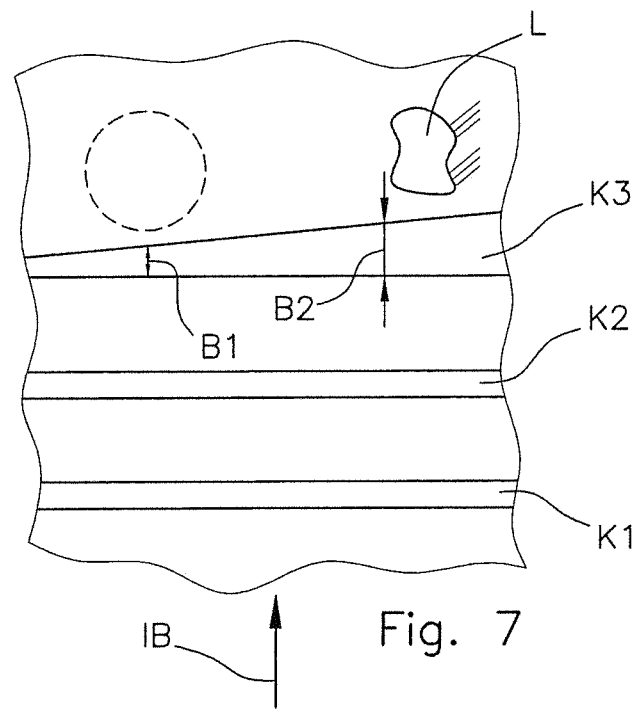
FIG. 7 schematically shows a top view of a surface of the sample portion provided with notches, in accordance with another example.

FIG. 7 schematically shows a top view of an upper side of a sample portion provided with notches in accordance with another example. In this case, the third notch K3 lying closest to the target region ZB has a width varying in the direction of extent, with the width increasing continuously from left to right in the exemplary case such that there is a wedge-shaped design of the notch in a top view. After the preceding explanations, it is apparent that, in the ion beam IB being radiated-in in the incoming radiation direction (arrow), material ablation will be greater in the region with the greater width B2 than behind the narrower portion with width B1, behind which the target region ZB is situated. Hence, in ion irradiation and increasing thinning of the thin sample portion, a hole L would initially form behind the wider notch portion with width B2, while the sought-after residual thickness with electron transparency remains in the target region.

There are various options to include the notch production operation in the overall process of the sample preparation. Some examples are illustrated on the basis of FIGS. 8A to 8C.

Figure 8A:
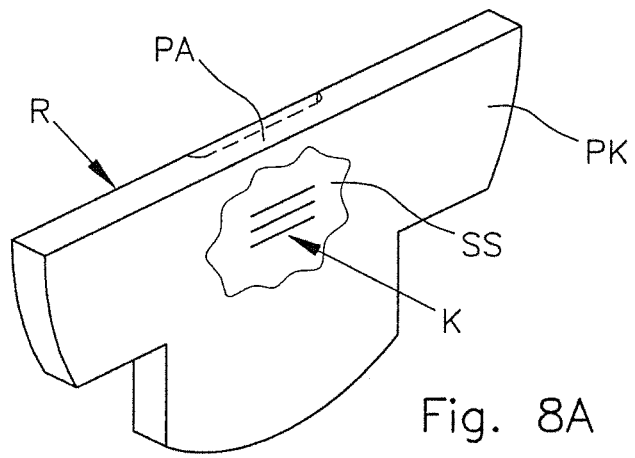
FIGS. 8A to 8C show different possibilities of including a notch production operation in the overall process of the sample preparation.

In the example in FIG. 8A, the notches K are introduced into the sample body PK on one side before the thinner sample portion PA is produced by laser processing of the sample body. That is to say, the notches are introduced on one side during the cut-out stage, i.e., when the sample portion has not yet been thinned further to approximately 10 to 20 µm. The subsequent rear thinning then takes place from the opposite rear side R depicted by dashed lines. Thinning may also be carried out from both sides, but this is not mandatory. This example offers the option of coating the regions into which the notches are intended to be introduced, i.e., the terracing zone, with a protective layer SS prior to introduction of the notches, the notches then being introduced through the protective layer. With the aid of the protective layer, deposition of processing remains (debris) at the edges of the notch and in the adjoining regions of the surface are able to be reduced to a minimum. After introduction of the notches, the protective layer, including the deposits adhering thereto, is able to be removed without residue. As a result, it is possible to obtain notches with particularly clearly defined edges and clean adjoining surfaces.

Figure 8B:
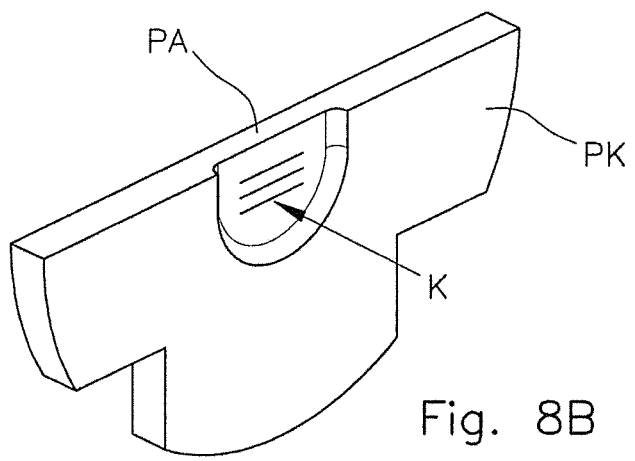

In the example of FIG. 8B, the notches K are introduced into the thin sample portion PA on one side from the side which was already recessed proceeding from the sample body to produce the thin sample portion PA. After production of the notches, the sample portion can then be thinned further from the opposite rear side, optionally to the extent that the notches pass from the depicted front side through to the not visible rear side after termination of the thinning. In this example too, a protective layer may be applied, temporarily where necessary, through which the notches are produced.

Figure 8C:
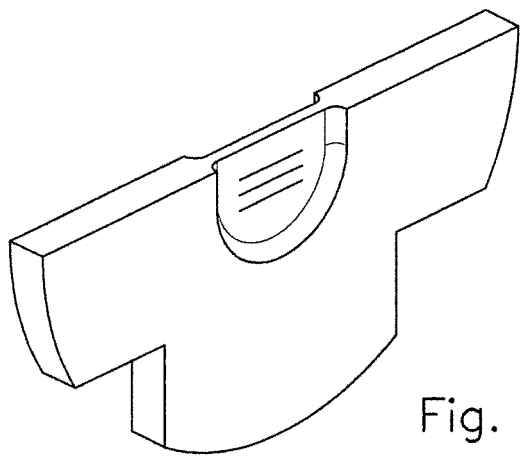

In the example of FIG. 8C, the notches K are introduced after completion of the thin sample portion PA, which has been reduced to the target thickness thereof. Here too, use can be made of a protective layer which may then have an additional stabilizing function.

Figure 9:
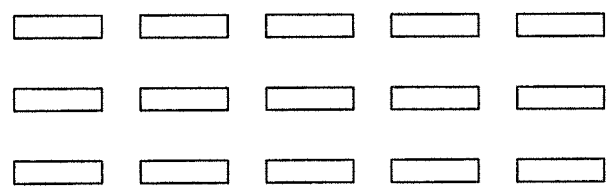
FIG. 9 shows an example in which the notches are designed as notches interrupted I the direction of extent.

It is possible to introduce the notches only at a few positions, for example, in the form of families of parallel notches. It is also possible for individual notches, or all notches, to be designed as notches interrupted in the direction of extent, as depicted schematically in FIG. 9. Additionally, the parallel notches may have an offset in the line direction, for example, an offset by the length of an individual notch. It is also possible for a plurality of families of parallel notches to be introduced, each of which are assigned to specific target positions. In the interest of the shortest possible processing times for production of the notches and in view of the mutual influencing of the ablated material and stability, it is normally expedient to apply as few notches as possible, for example, between two and six notches in relation to one target region.

It is possible to radiate in the ion beam such that it radiates in from the same incoming radiation direction during the entire operating duration. It is also possible to carry out ion irradiation using an azimuthally oscillating ion beam, i.e., an ion beam which, during duration of the ion irradiation, has a periodically or aperiodically varying incoming radiation direction over a certain angle of incidence range. This may be expedient, inter alia within the scope of reducing possibly occurring curtaining. In these examples, it may also be helpful to transition from a perfectly straight form of notches to adapted forms, for example, to a semi-circular form or an elliptical form. An example with notches K1, K2 arranged in semi-circular fashion about the target region ZB is shown schematically in FIG. 10. The incoming radiation direction of the ion beam IB varies periodically during the ion beam processing, for example, by ±5° about a principal incoming radiation direction such that the ion beam at a time $t_1$ is incident from a different direction than at an earlier or later time $t_2$.

In the general case, the position and form of notches, and the number thereof, may be varied to achieve a desired workflow. In particular, these parameters are able to be varied such that, during subsequent ion beam processing, an etching rate which is as high as possible is achieved to promote quick sample preparation. Since the dependence of the etching rate on the angle of incidence may differ from material to material, the controlled notch geometries and numbers may also be different for different materials.

Figure 10:
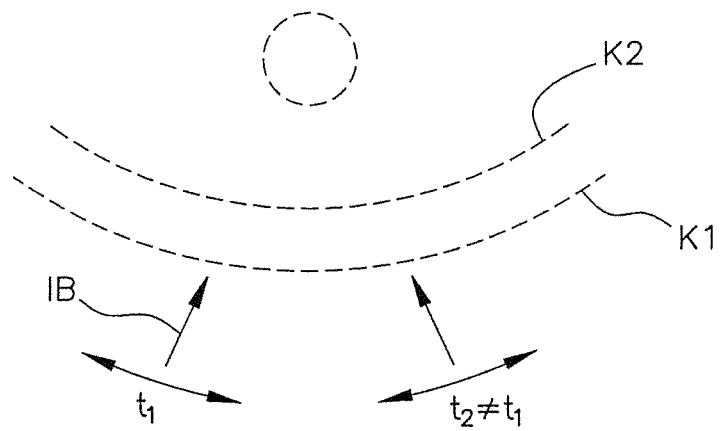
FIG. 10 shows an example with notches arranged around a target region in a semi-circular manner and an azimuthal variation of the incoming radiation direction of the ion beam.

At the flank opening by a notch, the local ion angle of incidence emerges as sum of the vertical ion angle of incidence (which changes if there is a change in the glancing angle and remains constant in the case of a constant glancing angle) and of the azimuthal ion angle of incidence (cf. FIG. 10). These two angles of incidence can be selected such that an etching rate which is as high as possible emerges.

In general, it may be expedient to select an ideal azimuthal angle in a manner matched to the maximum of the angle-dependent ablation rate. This can also be achieved by arranging notches in a manner not parallel to the upper edge of the sample (cf. side S in FIG. 1) but at an angle thereto or by the selection of a relative ion angle of incidence during the ion beam post-processing. Radiating in the ions therefore need not take place more or less perpendicular to the direction of extent of a notch, but oblique instances of radiating in are also possible, for example, such that incoming radiation direction and notch extent lie at an angle of 30° to 60° in relation to one another. In this way, fixed step heights can be slightly increased (that is to say in fractions of the typical step height), for example, to set a specific residual thickness of the electron-transparent region.

As already mentioned, oscillations of the ion beam about a defined principal incoming radiation direction (e.g., by)±10° are also possible. Since, in most cases, the changes of the ablation rate with the angle of incidence in the region of the maximum of the ablation rate are initially only very small in small changes by a few degrees, no substantial losses in the obtainable ablation speed emerge as a result of a correspondingly small oscillation of the incoming radiation direction during the ion beam processing.

Since the glancing angle of the ion beam has an effect on the height of the terrace step which is predictable by analysis, a variation of the vertical angle of incidence is therefore possible, in addition to the variation possibilities mentioned before, or in combination therewith, to set a desired target ablation depth. As a result, incalculable factors of the step depth, which may arise due to gradual rounding of the edge of the front flank (cf., e.g., KT1 in FIG. 2D), can be counteracted on the basis of a residual thickness determination.

In the general case, it is possible to design the time profile of both the azimuthal incoming radiation direction and the vertical incoming radiation direction in a targeted manner, and possibly vary these too, such that a predetermined, laser-processed initial edge structure in the target region leads to the desired lowering, which is as plane-parallel as possible.

It is also possible to embody the notches not as notches with a constant width, but possibly to provide local instances of thickening or a gradual widening (cf. FIG. 7). As a result, it is possible to provide thickness test regions for measurement purposes or for the optical acquisition (cf. FIG. 7).

What can be achieved using the aforementioned approaches, and other possible approaches, is that, for example, on a sample pre-processed by laser processing with a thin sample portion, the latter may be conditioned locally such that the subsequent ion irradiation matched thereto may generate an optimum sample, which is ideally only a few 10 nm thick and not perforated in the target region, in the shortest possible time. For the purposes of process control, use can be made of the aforementioned in-line thickness measurement with the aid of thickness test regions which are predeterminable in a targeted manner. Alternatively, wedge-shaped lamellas and/or notches, which vary in terms of the width thereof, may also be used as thickness markers.

Figure 11:
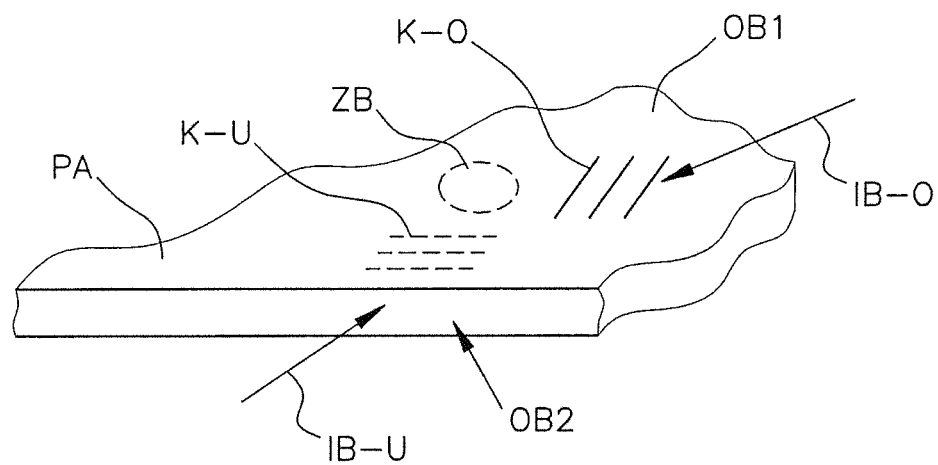
FIG. 11 shows an example in which a plate-like sample portion is provided on both sides with differently oriented notches and processed with ion beams from adapted different directions.

FIG. 11 shows a further example in which a plate-like sample portion PA is provided on both sides, i.e., both on its first surface OB1 (front side) and on its opposite second surface OB2 (rear side), with a terracing zone. To this end, three mutually parallel notches K-O were introduced on the first surface OB1 to the right of the target region ZB in the shown illustration by a focused laser beam. Three mutually parallel notches K-U, the linear directions of extent thereof extending perpendicular to the linear directions of extent of the notches K-O on the first surface OB1, were introduced on the opposite second surface OB2. During the phase of the ion beam processing, an ion beam IB-O is radiated onto the first surface OB1 with grazing incidence such that the target region ZB lies behind the upper notches K-O. On the opposite rear side, the incoming radiation direction of the lower ion beam IB-U extends substantially perpendicular to the incoming radiation direction of the other ion beam such that the target region lies behind the lower notches K-U depicted by dashed lines. As a result, material ablation from both sides with mutual overlap and ion irradiation from different incoming radiation directions emerge in the provided examination region, particularly in the region of the target region ZB, as result of which there is increased mechanical stability.

Ion beam post-thinning processes can be controlled such that an ideally non-perforated TEM sample arises in a locally targeted manner and with a speed significantly increased in relation to conventional processes, the TEM probe having a residual thickness able to be predetermined with a high accuracy and having a suitable electron transparency in the target region.

Figure 12:
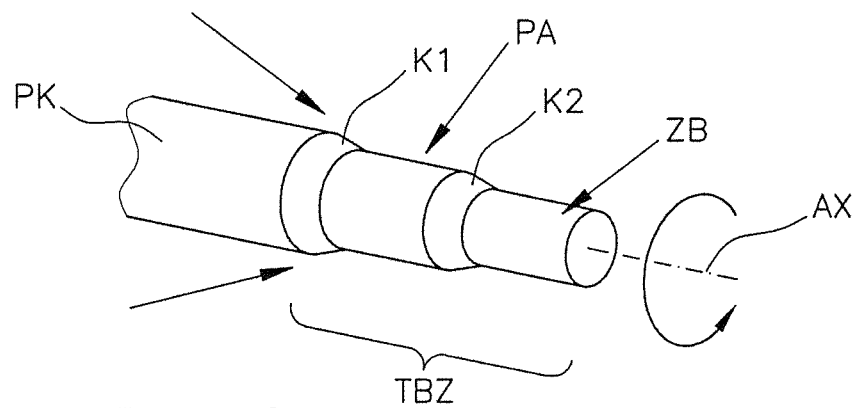
FIG. 12 schematically shows preparation of a rotationally symmetric sample to examine the microstructure with the aid of atomic probe tomography (APT) or x-ray tomography or x-ray microscopy (XRM).
Figure 13:
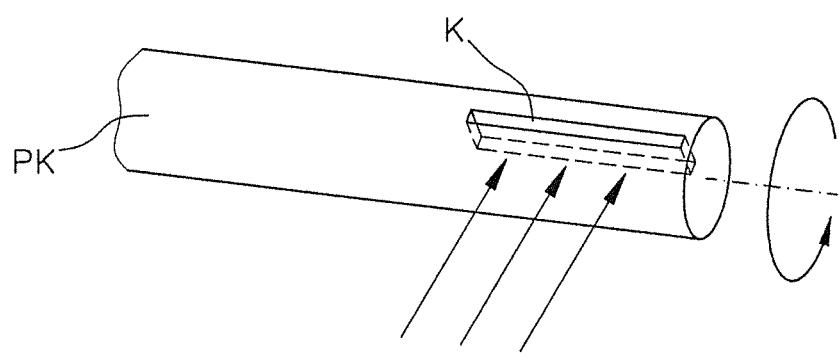
FIG. 13 schematically shows a different preparation of a rotationally symmetric sample for examination of the microstructure with the aid of atomic probe tomography or x-ray tomography or x-ray microscopy.

FIGS. 12 and 13 show different options of preparing a sample P intended to be prepared for examining the microstructure of the sample material with the aid of atomic probe tomography (LEAP) or x-ray tomography or x-ray microscopy (XRM).

In the example in FIG. 12, the sample body PK has a generally rotationally symmetric design in relation to a central axis AX and still is a cylindrical piece of material at the start of the preparation. During the method, encircling notches K1, K2 are introduced by radiating in a laser beam while at the same time rotating the sample body about the axis AX thereof. The target region ZB is situated in the depicted free end of the sample portion PA. There, the sample should be particularly thin and have a relatively small diameter (e.g., a few ten nanometers). The notches define a terracing zone TBZ, within which the sample should be thinned step-by-step by ion irradiation or reduced in terms of the diameter thereof. This is achieved by subsequently radiating-in at least one ion beam IB with grazing incidence onto the cylindrically curved surface of the sample portion PA. The incoming radiation directions of the ion beams symbolized by arrows are at an acute angle of, e.g., 4 and 10° in relation to the axial direction of the sample rotating about the axis such that corresponding grazing incidence on the one-dimensional curved surface is present. The projection of the incoming radiation direction on the axis AX is perpendicular to the directions of extent of the encircling notches. In the region of the notches, steps form according to the principle already described above, the steps, in the example, leading after a sufficient etching duration to the diameter in the front portion containing the target region ZB being approximately four step-heights lower than the diameter in the cylindrical portion of the sample body in front of the first notch K1. It is therefore possible to prepare a stepped tip, or a step-by-step diameter tapering in the case of an initially cylindrical sample body.

In the example of FIG. 13, a notch K extends parallel to the axis AX of the cylindrical sample body PK. If the sample body is now rotated about its axis AX during the ion irradiation, material is able to be peeled from the end of the sample body to be prepared, like the bark from a tree, or it can be ablated by ion irradiation. The circumferential speed of the rotating surface may be matched to, e.g., the speed of advance of the steps such that these speeds are approximately the same.

In the examples described previously on the basis of the figures, the notches were produced by laser irradiation using a focused laser beam. However, this is not mandatory.

Figure 14:
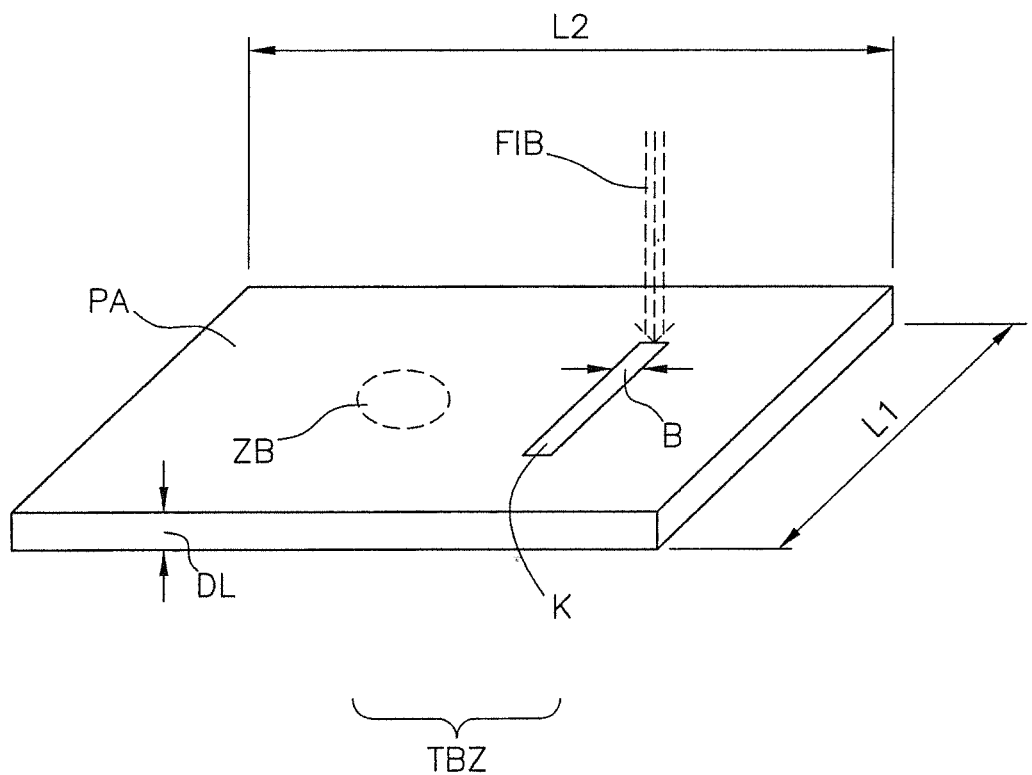
FIG. 14 schematically shows preparation of an FIB lamella, wherein a notch is produced next to a target region by a focused ion beam.

FIG. 14 shows an example of a sample portion PA in the form of a plane-parallel plate with a very small thickness DL, as is typical for so-called FIB lamellas. By way of example, the thickness DL may be 500 nm to 1 μm and the edge lengths L1 and L2 may lie in the low micrometer range, for example, of about 20 μm (longer side) to about 5 μm (shorter side). The plate-shaped sample portion was prepared from a larger piece of material of the material to be examined by a focused ion beam (FIB).

On the FIB lamella, at least one notch K is introduced into a terracing zone TBZ containing the target region ZB. In contrast to the previous examples, the notch is introduced into the surface by irradiating the surface OB using a focused ion beam (FIB). In this case, the notch widths may be significantly smaller than in processing with a focused laser beam. Notch widths may be in the low or mid nanometer range, for example, from 50 nm to 250 nm, and also slightly thereabove. In typical incoming radiation conditions of a focused broad ion beam with grazing incidence in a subsequent ion beam processing operation, that is to say, e.g., with glancing angles from 5 to 20°, it is possible to obtain instances of lowering of the surface level or step heights of the order of a few 10 nm behind the notch, for example, from 30 nm to 100 nm, or thereabove. With the aid of one or more of these notches, for example, with the aid of three mutually parallel notches, each with a width of 50 to 100 nm and a distance of 100 nm to 200 nm between them, it is possible to reduce the thickness DL of the sample portion in a targeted manner to such an extent that the sought-after electron transparency is present in the target region with, at the same time, a comparatively high mechanical stability.

The invention claimed is:

1. A method of preparing a sample for microstructure diagnostics by preparing a sample portion on a sample body by material-ablating processing, and subsequently producing an examination region on the sample portion, the examination region comprising a target region to be examined, the method comprising:
   producing a terracing zone comprising the target region on at least one surface of the sample portion, wherein producing the terracing zone comprises:
   producing a plurality of notches with flanks extending obliquely in relation to the at least one surface of the sample portion next to the target region by material-ablating beam processing, the plurality of notches extending at a distance from one another and in parallel to one another; and
   ablating material from the at least one surface of the sample portion in the target region in the terracing zone by radiating an ion beam under grazing incidence onto the at least one surface obliquely to a direction of an extent of the plurality of notches such that the target region lies behind the plurality of notches based on an incoming radiation direction of the ion beam relative to the plurality of notches such that the at least one surface of the sample portion is recessed substantially parallel to an original height of the at least one surface by ion beam processing resulting in forming a terrace in the terracing zone behind the plurality of notches,
   wherein the terracing zone has an area that encompasses the target region and the plurality of notches.

2. The method according to claim 1, wherein an electron-transparent examination region, in which the target region lies, is produced in the sample portion.

3. The method according to claim 1, wherein the plurality of notches are introduced into the at least one surface by laser beam processing.

4. The method according to claim 1, wherein the distance between neighboring notches is matched to a width of the notches such that the distance lies between two times and ten times, a width of a single notch.

5. The method according to claim 1, wherein the notches are produced such that the distance between immediately adjacent notches is 20 µm to 100 µm.

6. The method according to claim 1, wherein each notch is produced such that a width at the at least one surface is 10 µm to 50 µm.

7. The method according to claim 1, wherein at least one notch having a width varying in the direction of extent is produced, and no further notch lies between that notch and the target region.

8. The method according to claim 1, wherein at least one notch having a non-linear extent with a changing direction of extent is produced, and no further notch lies between that notch and the target region.

9. The method according to claim 1, wherein the sample portion is processed on both sides, and the plurality of notches are introduced both on a first surface of the sample portion and on an opposite second surface of the sample portion such that respectively one terracing zone arises on both surfaces of the sample portion and in that material in the target region of the terracing zone is subsequently ablated on the first surface and on the second surface by an ion beam under grazing incidence.

10. The method according to claim 1, wherein a protective layer is applied to the at least one surface prior to the material-ablating beam processing to produce the plurality of notches, and the plurality of notches in the sample portion is subsequently produced through the protective layer and the protective layer is subsequently removed from the surface.

11. The method according to claim 1, wherein the incoming radiation direction of the ion beam in an azimuthal direction and/or in a vertical direction is varied periodically or aperiodically over an angle of incidence range when ablating the material by the ion beam.

12. The method according to claim 1, further comprising conducting an in-line thickness determination to determine a thickness of the sample portion in the target region of the terracing zone while ablating material by an ion beam.

13. A sample for microstructure diagnostics obtainable or obtained by the method of claim 1, comprising:
the sample portion having the examination region comprising the target region to be examined,
wherein at least one notch with flanks extending obliquely in relation to the surface lies next to the examination region on the at least one surface of the sample portion and a surface level on a side of the notch distant from the examination region is higher than the surface level in the examination region.

14. The sample according to claim 13, wherein the examination region is an electron-transparent region, and a sample thickness on the side of the plurality of notches distant from the electron-transparent region is greater than in the electron-transparent region.

15. The method according to claim 1, wherein ablating material from the at least one surface of the sample portion in the target region of the terracing zone by radiating an ion beam is performed using a broad ion beam (BIB).

16. The method according to claim 1, wherein the plurality of notches comprises two, three, four, five or six notches arranged at a distance from one another are produced in the terracing zone.

* * * * *